US009134478B2

(12) United States Patent
Park et al.

(10) Patent No.: US 9,134,478 B2
(45) Date of Patent: Sep. 15, 2015

(54) HYBRID OPTICAL APPARATUSES INCLUDING OPTICAL WAVEGUIDES

(71) Applicant: Intel Corporation, Santa Clara, CA (US)

(72) Inventors: Hyundai Park, Edison, NJ (US); Richard Jones, San Mateo, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/128,938

(22) PCT Filed: Sep. 16, 2013

(86) PCT No.: PCT/US2013/059999
§ 371 (c)(1),
(2) Date: Dec. 23, 2013

(87) PCT Pub. No.: WO2015/038164
PCT Pub. Date: Mar. 19, 2015

(65) Prior Publication Data
US 2015/0078703 A1    Mar. 19, 2015

(51) Int. Cl.
*G02B 6/12*     (2006.01)
*H01L 31/0232*  (2014.01)
*H01L 33/58*    (2010.01)
*H01S 5/026*    (2006.01)
*B82Y 20/00*    (2011.01)

(52) U.S. Cl.
CPC ............ *G02B 6/12* (2013.01); *H01L 31/02327* (2013.01); *H01L 33/58* (2013.01); *H01S 5/026* (2013.01); *B82Y 20/00* (2013.01); *G02B 2006/121* (2013.01); *G02B 2006/12128* (2013.01); *Y10S 977/755* (2013.01)

(58) Field of Classification Search
CPC .... G02B 6/43; G02B 6/12004; G02B 6/4214; B82Y 30/00; B82Y 10/00; B82Y 20/00
USPC .................... 385/14, 27–29, 39, 43; 977/755; 438/478
See application file for complete search history.

(56) References Cited

U.S. PATENT DOCUMENTS

| 5,379,318 | A  | * | 1/1995  | Weber ............................ 372/96 |
| 5,748,660 | A  | * | 5/1998  | Delorme et al. ........... 372/50.11 |
| 6,411,757 | B1 |   | 6/2002  | Brener et al. |
| 6,690,694 | B2 | * | 2/2004  | Deacon ........................ 372/29.02 |
| 2002/0197013 | A1 | * | 12/2002 | Liu et al. .......................... 385/37 |
| 2008/0273567 | A1 |   | 11/2008 | Yariv et al. |
| 2009/0116523 | A1 |   | 5/2009  | Leem et al. |
| 2012/0320939 | A1 |   | 12/2012 | Baets et al. |
| 2013/0195137 | A1 |   | 8/2013  | Bowers et al. |

OTHER PUBLICATIONS

International Search Report and Written Opinion for PCT Application No. PCT/US2013/059999, dated May 24, 2014, 13 pages.

* cited by examiner

*Primary Examiner* — Ellen Kim
(74) *Attorney, Agent, or Firm* — Schwabe Williamson & Wyatt PC (57) ABSTRACT

Described are embodiments of hybrid optical apparatuses including anti-resonant optical waveguides, and methods for making such apparatuses and systems. In one embodiment, a hybrid optical apparatus may include a first semiconductor region including an active region of one or more layers of semiconductor materials and a second semiconductor region coupled with the first semiconductor region. The second semiconductor region may include an optical waveguide configured to transmit light inputted by a light input component. The optical waveguide may be defined by a first trench disposed on a first side of the waveguide, and a second trench disposed on a second side of the waveguide opposite the first side. A width of each trench may vary along a length of the apparatus to control optical power density of the light transmitted along the optical waveguide. Other embodiments may be described and/or claimed.

25 Claims, 7 Drawing Sheets

HYBRID OPTICAL APPARATUSES INCLUDING OPTICAL WAVEGUIDES

GOVERNMENT INTEREST

This invention was made with Government support under contract number H98230-10-9-0021 awarded by the Department of Defense. The Government has certain rights in this invention.

CROSS REFERENCE TO RELATED APPLICATION

The present application is a national phase entry under 35 U.S.C. §371 of International Application No. PCT/US2013/059999, filed Sep. 16, 2013, entitled "HYBRID OPTICAL APPARATUSES INCLUDING OPTICAL WAVEGUIDES," which designates, among the various States, the United States of America, and the entire contents and disclosures of which are hereby incorporated by reference in their entireties.

TECHNICAL FIELD

Embodiments of the present disclosure relate generally to the field of photonic devices. More particularly, embodiments of the present disclosure relate to an apparatus having a heterogeneously integrated hybrid laser, amplifier and/or a hybrid photodetector that may include anti-resonant optical waveguides.

BACKGROUND

Semiconductor hybrid optical apparatuses such as lasers, amplifiers or photodetectors may be made from light-emitting and absorbing electro-optic properties of III-V semiconductor materials. Optical apparatuses may be composed of two components, a III-V active region to generate, or absorb light and a silicon waveguide to carry the light.

The optical mode of some optical apparatuses may be controlled by the waveguide dimensions. In general, a high overlap of the optical mode with the III-V region of the optical apparatuses is desired. Pushing the optical mode into the III-V region, however, may sometimes result in optical mode leakage and/or widening of the optical mode.

BRIEF DESCRIPTION OF THE DRAWINGS

Embodiments of the present disclosure will be described by way of example embodiments, but not limitations, illustrated in the accompanying drawings in which like references denote similar elements, and in which.

DETAILED DESCRIPTION

Described herein include embodiments of a hybrid optical apparatus having anti-resonant optical waveguides, a system including the hybrid optical apparatus having optical waveguides, and a method for forming a hybrid optical apparatus including optical waveguides.

In the following detailed description, reference is made to the accompanying drawings which form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Figure 1:
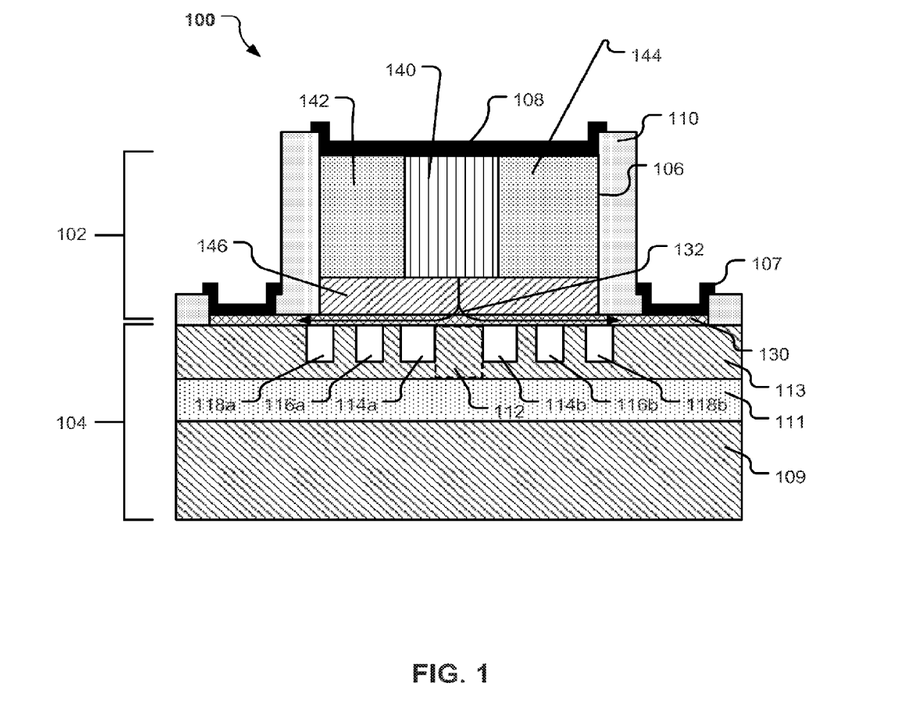
FIG. 1 illustrates a cross-section of a hybrid optical apparatus including anti-resonant waveguides according to some embodiments.

FIG. 1 illustrates a cross-section of an example hybrid optical apparatus 100 including a first semiconductor region 102 and a second semiconductor region 104 coupled with the first semiconductor region 102. The first semiconductor region 102 may include an active region 106 and one or more electrical contacts 107, 108 coupled with the active region 106 to provide an electrical current to the active region 106. The first semiconductor region 102 may include an insulating material 110 covering portions of the active region 106 and/or the first semiconductor region 102.

The second semiconductor region 104 may include an optical waveguide 112 indicated generally by the region demarcated by the hashed-line box. The optical waveguide 112 may be defined by a pair of anti-resonance waveguide trenches 114a, 114b (hereinafter "trenches," "anti-resonance waveguide trenches," and "waveguide trenches" will be used interchangeably). In various embodiments, anti-resonance waveguides may include anti-resonance waveguide trenches 116a, 118a may be disposed on a first side of the optical waveguide 112, and anti-resonance waveguide trenches 116b, 118b may be disposed on a second side, opposite the first side, of the optical waveguide 112, as shown. The waveguide trenches 114a, 114b and the anti-resonant waveguide trenches 116a, 116b, 118a, 118b may be filled with a gas. In various embodiments, the gas may be air, an inert gas, or other gas. In some embodiments, the gas may be any gas that may be trapped in the trenches 114a, 114b, 116a, 116b, 118a, or 118b during processing. In other embodiments, the waveguide trenches 114a, 114b and/or the anti-resonant waveguide trenches 116a, 116b, 118a, 118b may be filled with another low-refractive index material such as, for example, silicon oxide or silicon nitride.

The trenches 116a, 116b, 118a, 118b may provide anti-resonant reflection to control the optical mode width while still allowing the optical waveguide 112 to control the overlap of the optical mode with the active region 106. In various embodiments, the trenches 116a, 116b, 118a, 118b may provide additional reflections of the optical mode during operation of the hybrid optical apparatus 100, which may help control the lateral extension of the optical mode.

The second semiconductor region 104 may comprise any suitable material or materials for forming a hybrid optical apparatus. In various embodiments, the second semiconductor region 104 may comprise a semiconductor substrate. For example, the second semiconductor region 104 may comprise a silicon-on-insulator substrate comprising a handle substrate 109, a buried insulating layer 111 on the handle substrate 109, and a silicon layer 113 on the buried insulating layer 111. The buried insulating layer 111 may comprise oxide. In various embodiments, the buried insulating layer 111 may comprise sapphire or another suitable insulating material. The handle substrate 109 may comprise silicon, such as, for example, doped silicon. In various embodiments, the silicon layer 113 may comprise a device fabrication wafer or epitaxial silicon.

In other implementations, the second semiconductor region 104 may be formed using alternate materials, which may or may not be combined with silicon, that include but are not limited to germanium, indium antimonide, lead telluride, indium arsenide, indium phosphide, gallium arsenide, or gallium antimonide. Further materials classified as group III-V or group IV materials may also be used to form the substrate. Although a few examples of materials from which the substrate may be formed are described here, any material that may serve as a foundation upon which a semiconductor device may be built falls within the spirit and scope of the present disclosure.

The active region 106 of the first semiconductor region 102 may be a III-V active region including layers of semiconductor materials from group III, group IV, or group V semiconductor. In various embodiments, the active region 106 may include a current channel 140, implanted layers 142, 144, and a multiple quantum well (MQW) layer 146. In some embodiments, the current channel 140 and the layers 142, 144, and 146 may include different sub-layers and may be composed of various materials, such as, of p-type indium gallium arsenide (InGaAs), p-type indium phosphide (InP), p-type aluminum gallium indium arsenide (AlGaInAs), and the like.

The MQW layer 146 may be coupled to the layer 130, which may be composed of n-type indium phosphide (InP). The layers discussed above may have slight differences in their atomic ratios to tune the exact bandgap, according to one embodiment of the present disclosure.

The silicon layer 113 of the second semiconductor region 104 may provide a path of electric current to the contacts 107, or 108. The layer 113 may extend laterally on either side of the active region 106 to connect with the electrical contacts 107, and the optical waveguide 112 may be formed directly under the layer 130. In one embodiment, trenches 114a, 114b formed on the sides of the optical waveguide 112 confine light within the waveguide 112. The optical waveguide 112 may carry the optical signal to be amplified or detected.

In various embodiments, the spacing and/or width of the anti-resonant waveguide trenches 116a, 116b, 118a, 118b and the waveguide trenches 114a, 114b may contribute to reducing the optical leakage loss of the hybrid optical apparatus 100 and/or the location of the optical mode. The optical waveguide 112 may have a width configured for providing a suitable optical mode overlap with the active region 106. In various embodiments, the width of the optical waveguide 112 may be about 0.4 µm. In various embodiments, the trenches 114a, 116a, and 118b may separated from each other by about 1.0 µm (i.e., about 1.0 µm of the silicon layer 113 separates the waveguide trench 114a from the anti-resonant waveguide trench 116a, and about 1.0 µm of the silicon layer 113 separates the anti-resonant waveguide trench 116a from the anti-resonant waveguide trench 118a). The other side of the optical waveguide 112 may be similarly configured.

In various embodiments, the waveguide trenches 114a, 114b may each have a width of about 0.5 µm. In other embodiments, the waveguide trenches 114a, 114b may each have a width of about 3.0 µm. In other embodiments, the waveguide trenches 114a, 114b may each have a width in a range of about 0.5 µm to about 3.0 µm.

Figure 2:
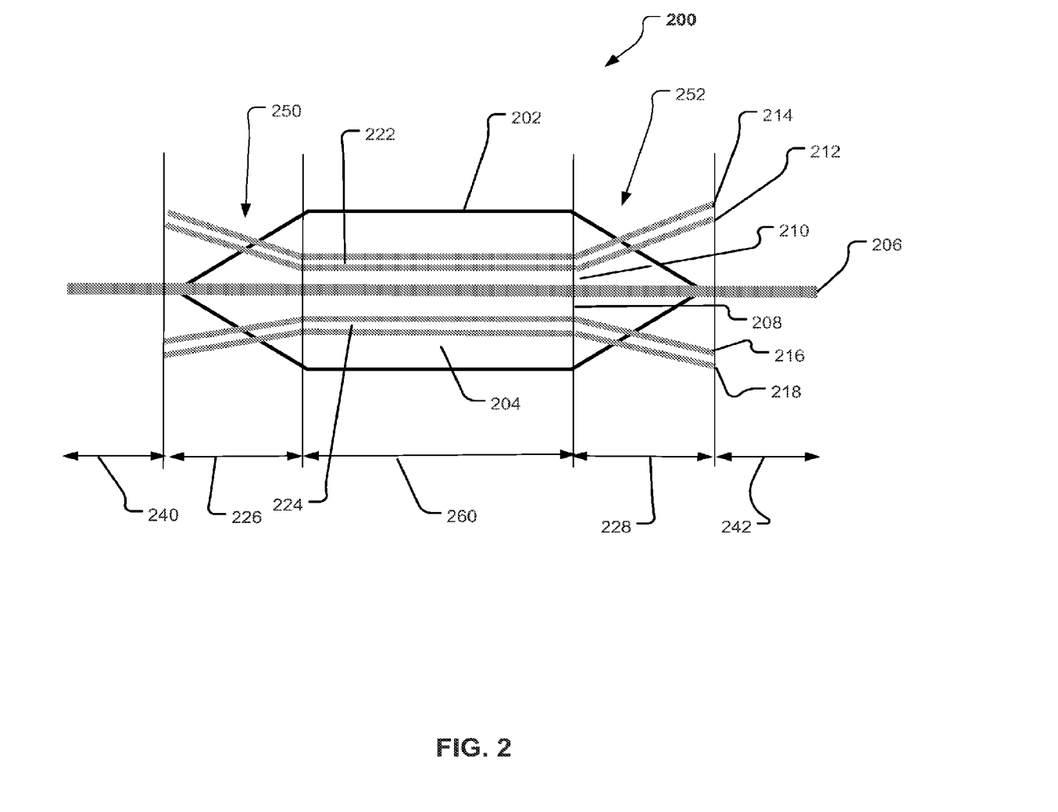
FIG. 2 illustrates a top-down view of an example hybrid optical apparatus according to some embodiments.

FIG. 2 illustrates a top-down view of an example hybrid optical apparatus 200 including the semiconductor region structure described in reference to FIG. 1, according to some embodiments. The hybrid optical apparatus 200 may include a first semiconductor region 202 (illustrated in this embodiment by a hexagon-shaped element) and a second semiconductor region 204 (shown and viewed partially through the first semiconductor region 202) similar to embodiments described in reference to FIG. 1. The second semiconductor region 204 may include an optical waveguide 206 defined by two trenches 208 and 210 on each side of the waveguide 206. Similar to embodiments described in reference to FIG. 1, the second semiconductor region 204 may further include one or more additional waveguides 212, 214, 216, and 218 defined in part by trenches 210, 222, and 224 respectively. A gain/absorption section of the apparatus 200 may comprise the first and second semiconductor regions 202 and 204 of the apparatus 200 and is indicated with the numeral 260.

In some embodiments, the second semiconductor region may be configured, around its respective ends to form first and second mode converters 226 and 228. Mode converters may be used to convert the optical mode in input light component 240 to the first and second semiconductor regions 202 and 204 and in the first and second semiconductor regions 202 and 204 to an output light component 242. In some embodiments, the mode converters 226 and 228 may be configured to provide connection with the light input component 240 coupled with the apparatus 200 and the light output component 242 coupled with the apparatus 200 as shown in FIG. 2. More specifically, the mode converters 226, 228 may be configured to provide desired coupling efficiency between the device 200 and the input and output light components 240 and 242, in order to reduce optical loss. For example, the waveguides and trenches of the second semiconductor region 204 may be configured with certain taper design parameters ensuring low loss and low reflection transition of the silicon input guide mode to the gain/absorption section 260 and low loss and low reflection transition of the gain/absorption section 260 to the silicon output guide mode. For example, in some embodiments, the widths of the waveguides 206, 212, 214, 216, and 218 and trenches 208, 210, 222, and/or 224 may be controlled along the length of the apparatus 200. For example, the waveguides 212, 214, 216, and 218 may be configured to be disposed in the mode converters 226, 228 at determined angles relative to the waveguide 206 (e.g., by manipulating the width of respective trenches defining the waveguides, as shown in FIG. 2).

In some embodiments, the mode converters 226 and 228 may be disposed in the first semiconductor region 202, in addition, or in the alternative to the embodiments described in reference to the second semiconductor region 204. For example, the first semiconductor region 202 may be extended to include the mode converters 226 and 228. More specifically, the first semiconductor region 202 may be shaped in a number different ways around its first end 250 and its second end 252 respectively. For example, in some embodiments, the first semiconductor region 202 may be shaped to taper around its first and second ends 250 and 252, as shown in FIG. 2.

The mode converters 226 and 228 may be configured in different variations, not necessarily limited to the embodiments described above. For example, the mode converters 226 and 228 disposed in the second semiconductor region 204 may be disposed underneath the tapered ends of the first semiconductor region 202 to provide for simultaneous conversion from the hybrid mode to silicon waveguide mode. In another example, the tapered ends of the first semiconductor region 202 may be disposed to precede and succeed respectively the corresponding waveguide portions configured at determined angles relative to the waveguide 206 as described above (viewed from the top down), providing for subsequent conversion, and the like. In some embodiments, the hybrid optical apparatus 200 described herein may be used as a hybrid amplifier, or hybrid photodetector, depending on a bias and other implementation details. For example, an embodiment of the apparatus 200 with a forward bias may be implemented as an amplifier, and an embodiment of the apparatus 200 with a reverse bias may be implemented as photodetector. In some embodiments, the hybrid optical apparatus 200 described herein may be used as a gain section of a hybrid laser. For example, an embodiment of the apparatus 200 with distributed Bragg gratings (DBR) formed outside of the apparatus may be implemented as a hybrid DBR laser.

Figure 3:
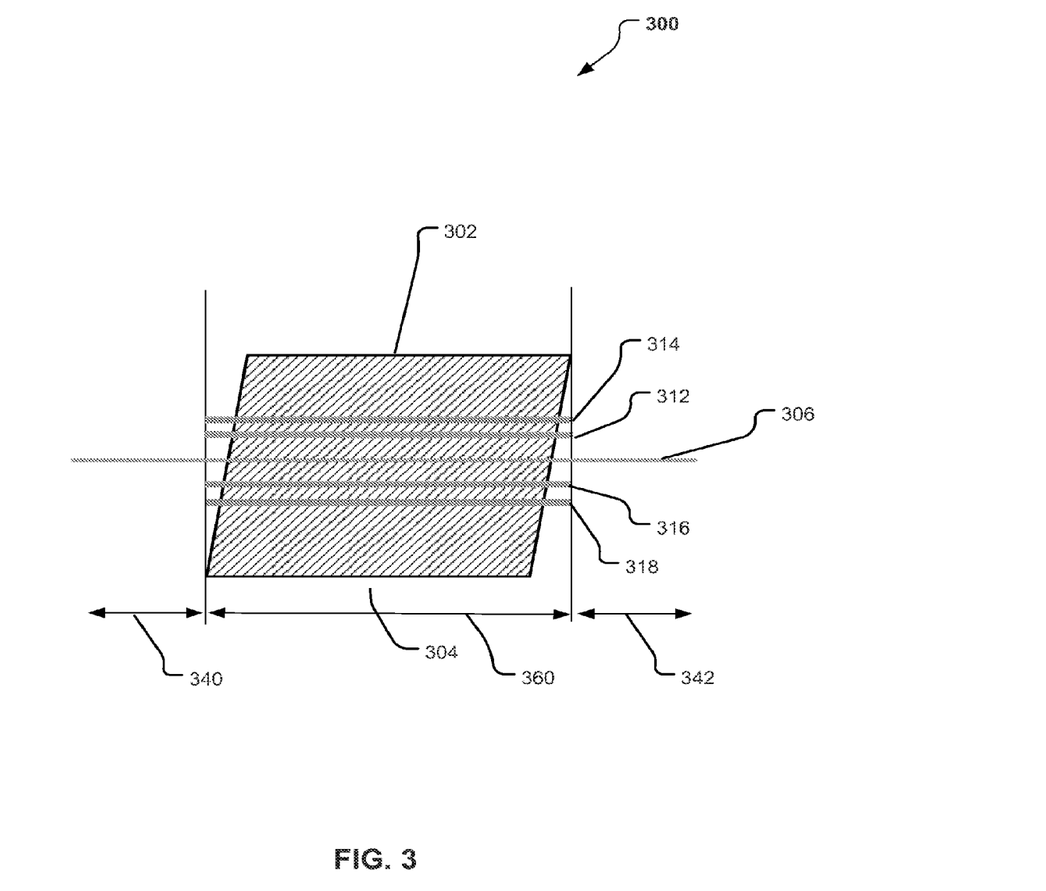
FIG. 3 is a top-down view of another example hybrid optical apparatus according to some embodiments.

FIG. 3 is a top-down view of another example hybrid optical apparatus 300 according to some embodiments. The apparatus 300 may include first and second semiconductor regions 302 and 304 similar to the embodiments described above. For simplicity purposes, some like numerals (e.g., ones indicating trenches) are omitted from FIG. 3.

As shown in FIG. 3, the apparatus 300 may be configured differently than the apparatus 200 described above. Specifically, a light input component 340 and a light output component 342 may be coupled to the apparatus 300 directly. In other words, as shown in FIG. 3, the III-V layers of the first semiconductor region 302 may be configured to abruptly terminate around the coupling with the light input and output components 302 and 304. Similarly, waveguides 306, 312, 314, 316, and 318 may be terminated around the coupling with the light input and output components 302 and 304. Such structure may excite high order modes in a gain/absorption section 360 of the apparatus 300 compared to the apparatus 200, and the optical losses associated with the apparatus 300 may be higher than ones associated with the apparatus 300. However, due to absence of the mode converters, the apparatus 300 may be configured to be smaller in size than the apparatus 200.

Figure 4:
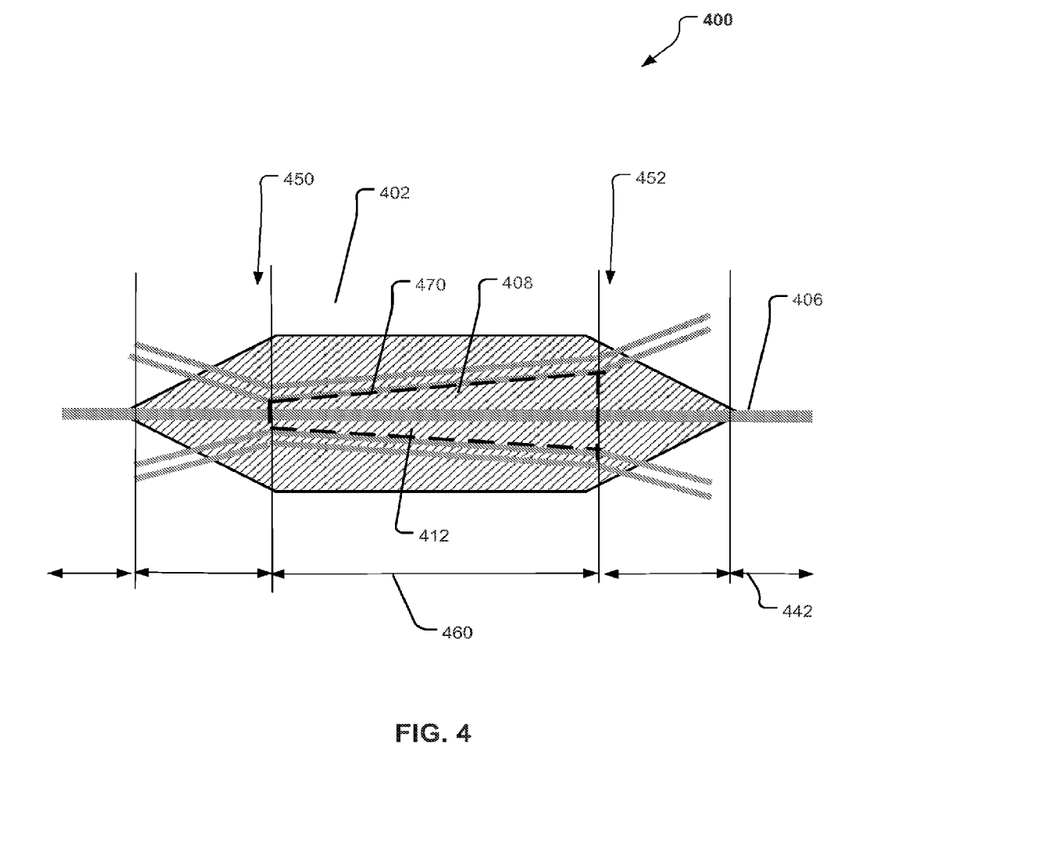
FIGS. 4 and 5 illustrate top-down views of example hybrid optical apparatuses according to some embodiments.
Figure 5:
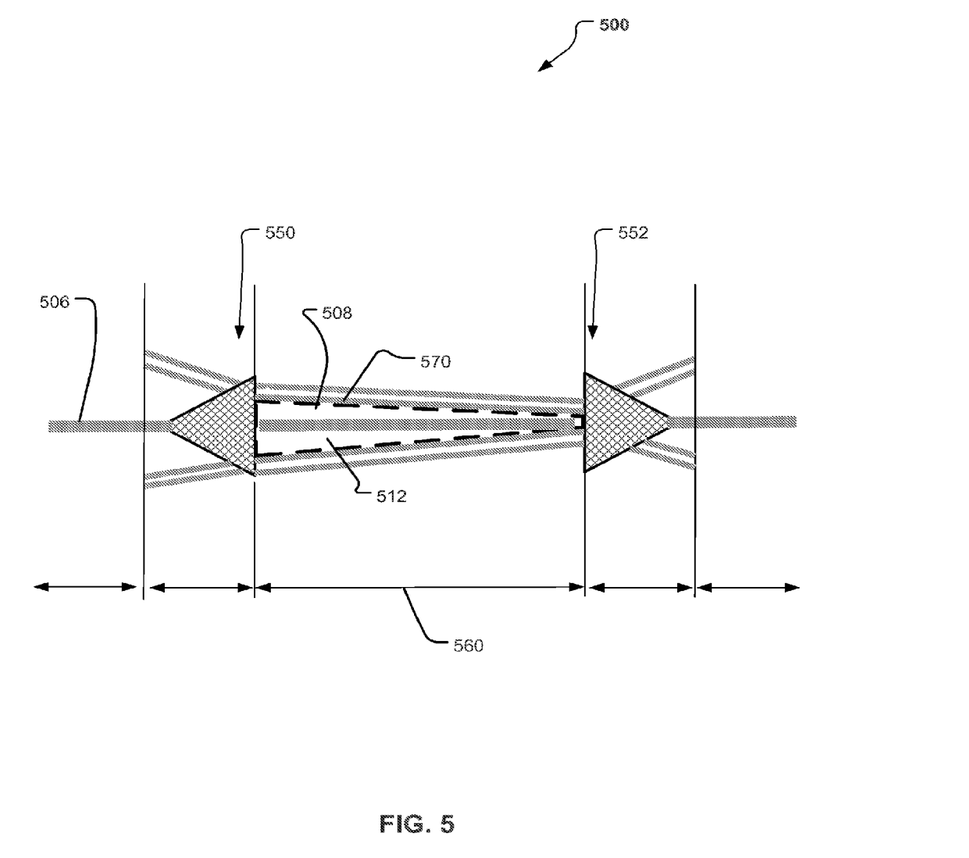

FIGS. 4 and 5 illustrate top-down views of example hybrid optical apparatuses 400 and 500 according to some embodiments. The apparatuses 400 and 500 may be used for high saturation power application, in some examples. As shown, the apparatuses 400 and 500 may be configured similar to the embodiments described in reference to FIG. 2, at least in some respects. For simplicity purposes, some like numerals of the elements described in reference to FIG. 2 are omitted in FIGS. 4 and 5. In some embodiments, the apparatuses 400 and 500 may be configured such that the width of the trenches may be varied along the length of the apparatuses 400 and 500. Depending at least in part on the trench configuration the apparatuses 400 (500) may be configured as a hybrid amplifier (400) or hybrid photodetector (500).

More specifically, in some embodiments, the apparatus 400 may be configured to amplify the light inputted in the apparatus 400 and passing along the waveguide 406. To achieve this, the trenches 408, 412 may be configured such that their respective widths may be narrow at a first end 450 and gradually widen toward a second end 452 of the gain/absorption section 460 of the apparatus 400, as shown in FIG. 4. Such structure of the trenches 408, 412 may provide for keeping the optical power density constant along the apparatus 400. Widening optical mode through controlling the trench width may balance the optical power density while optical power is amplified along the length of the apparatus 400. Accordingly, higher saturation power may be achieved compared to a constant trench width design of a gain/absorption section 260 in FIG. 2, in which the optical power density may increase, which may cause the saturation of the optical gain near the output of the apparatus 200.

In some embodiments, the shape of the current channel 470 (indicated by a dashed line) of the gain/absorption section 460 of the first semiconductor region 402 may be configured to substantially conform to the varied width of the trenches 408, 412. For example, the shape of the current channel 470 may be tapered in order to substantially conform to the variation of the trench width along the length of the apparatus 400, as shown in FIG. 4.

Referring now to FIG. 5, in some embodiments, the apparatus 500 may be configured to absorb the light passing along the waveguide 506 and accordingly may serve as a photodetector. For example, the width of the air trenches 508, 512 in the apparatus 500 may be configured to be wide around a first end 550 of the gain/absorption section 560 and gradually narrow down toward a second end 552, so that their corresponding width around the second end 552 of the apparatus 500 may be narrower than the width around the first end 550. In other words, for the high power detector design of the apparatus 500, the width of the trenches 508, 512 may be configured to gradually become narrower as the optical power decreases along the apparatus 500 due to absorption, to reduce the optical mode width accordingly to maintain constant optical power density.

In some embodiments, the shape of the current channel 570 (indicated by a dashed line) of the first semiconductor region 502 may be configured to substantially conform to the varied width of the trenches 508, 512. For example, the shape of the current channel 570 may be tapered as shown in FIG. 5 in order to follow the change of optical mode width as described above. In other embodiments, the photodetector may contain no implant channel like the current channel 570.

Figure 6:
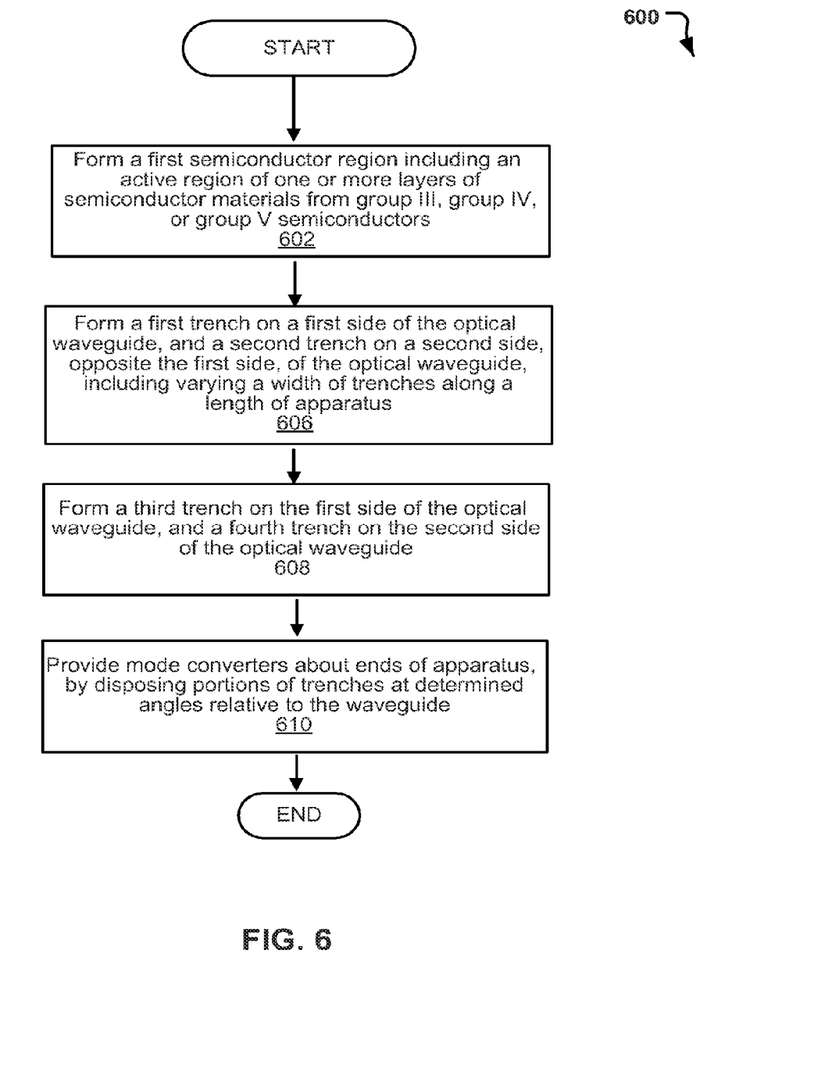
FIG. 6 is a process flow diagram of some of the operations associated with a method for making a hybrid optical apparatus, in accordance with various embodiments described herein.

FIG. 6 is a flow diagram of some of the operations associated with method 600 for making a hybrid optical apparatus, in accordance with various embodiments early described with references to FIGS. 1-5.

The method 600 for making the embodiments may include one or more functions, operations, or actions as is illustrated by blocks 602, 606, 608, and/or 610.

Processing for the method 600 may begin with block 602, where a first semiconductor region may be provided including an active region of one or more layers of semiconductor materials from group III, group IV, or group V semiconductors.

From block 602, the method 600 may proceed to block 606 where an optical waveguide in a second semiconductor region may be defined by a first trench on a first side of an optical waveguide, and a second trench on a second side, opposite the first side, of the optical waveguide, wherein the width of the trenches may vary along the length of the hybrid optical apparatus.

From block 606, the method 600 may proceed to block 608, where, optionally, a third trench on the first side of the optical waveguide may be formed such that the first trench is between the third trench and the optical waveguide, and a fourth trench on the second side of the optical waveguide may be formed such that the second trench is between the fourth trench and the optical waveguide.

From block 608, the method 600 may proceed to block 610, where mode converters may be provided about the ends of the apparatus, for example, by disposing portions of trenches at determined angles relative to the optical waveguide.

Embodiments of hybrid optical apparatuses and/or optical systems described herein may be incorporated into various other apparatuses and systems including, but not limited to, various computing and/or consumer electronic devices/appliances.

Figure 7:
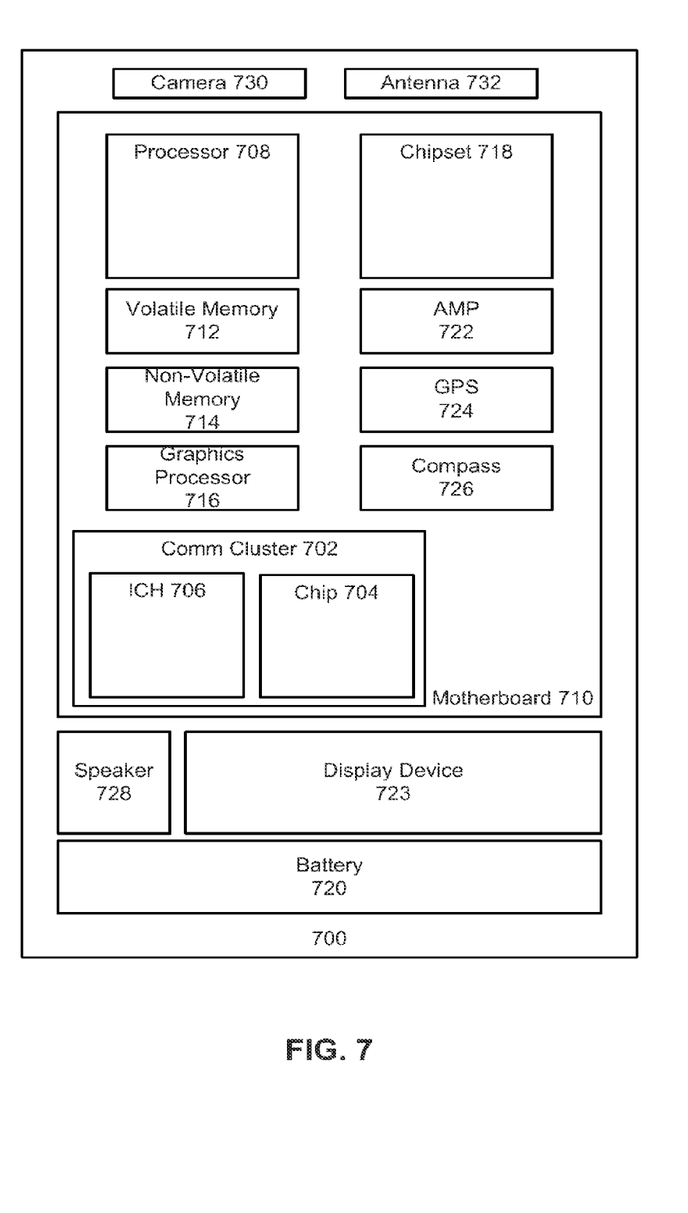
FIG. 7 is a block diagram of a system incorporating one or more of the hybrid optical apparatuses described herein in accordance with some embodiments of the present disclosure.

A system level block diagram of an example system 700 is illustrated in FIG. 7. The hybrid optical apparatuses and/or optical systems described herein may be included in one or more of the elements of the system 700. For example, in various implementations, the processor 708, the chipset 718, the communication chip 704, and/or the I/O controller hub 706 may include a hybrid optical apparatus as described herein for communicating with one or more other elements of the system 700 or connected to the system 700. In various embodiments, the system 700 may include more or fewer components, and/or different architectures than that shown in FIG. 7.

In various implementations, the system 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the system 700 may be any other electronic device that processes data.

The system 700 may include a communications cluster 702 configured to facilitate communication of the system 700 over one or more networks and/or with any other suitable device. The communications cluster 702 may include at least one communication chip 704 and at least one I/O controller hub 706. In some implementations, the I/O controller hub 706 may be part of the communication chip 704. In some implementations the communication chip 704 may be part of the processor 708.

In various embodiments, the system 700 may house a motherboard 710 with which the processor 708 and/or the communications cluster 702 may be physically and electrically coupled.

Depending on its applications, the system 700 may include other components that may or may not be physically and electrically coupled to the mother board. These other components include, but are not limited to, volatile memory 712 (e.g., DRAM), non-volatile memory 714 (e.g., ROM), flash memory, a graphics processor 716, a digital signal processor, a crypto processor, a chipset 718, a battery 720, an audio codec, a video codec, a power amplifier 722, a global positioning system (GPS) device 724, a compass 726, an accelerometer, a gyroscope, a speaker 728, a camera 730, an antenna 732, and a mass storage device (such as hard disk drive, compact disk (CD), digital versatile disk (DVD), and so forth).

The communication chip 704 may enable wireless communications for the transfer of data to and from the system 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 904 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 2G, 3G, 4G, 5G, and beyond. The system 700 may include a plurality of communication chips 704. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The system 700 may include a display device 734, such as, for example, a cathode ray tube (CRT), liquid crystal display (LCD), light emitting diode (LED), or other suitable display device. The display device 734 may be a touch screen display supporting touch screen features, and in various one of these embodiments, the I/O controller 706 may include a touch-screen controller. In various embodiments, the display device 734 may be a peripheral device interconnected with the system 700.

The embodiments described herein may be further illustrated by the following examples. Example 1 is hybrid optical apparatus comprising: a first semiconductor region including an active region of one or more layers of semiconductor materials; and a second semiconductor region coupled with the first semiconductor region, wherein the second semiconductor region includes an optical waveguide configured to transmit light inputted by a light input component coupled with the apparatus, wherein the optical waveguide is defined by a first trench disposed on a first side of the optical waveguide, and a second trench disposed on a second side of the optical waveguide opposite the first side of the optical waveguide, wherein a width of each trench varies along a length of the apparatus to control optical power density of the light transmitted along the optical waveguide.

Example 2 may include the subject matter of Example 1, and further specifies that the apparatus is coupled with a light output component configured to output the light transmitted by the optical waveguide.

Example 3 may include the subject matter of Example 1, and further specifies that the active region includes a current channel, the current channel comprising a multiple quantum well (MQW) layer.

Example 4 may include the subject matter of Example 3, and further specifics that the current channel is configured to have a width that substantially conforms to the varied width of the waveguide trenches.

Example 5 may include the subject matter of Example 1, and further specifies that the apparatus includes a first end and a second end, wherein the first end includes a light input component and the second end includes a light output component.

Example 6 may include the subject matter of Example 5, and further specifies that the trench width at the first end of the apparatus is narrower than the trench width at the second end of the apparatus, wherein the apparatus comprises a hybrid amplifier or a gain section of a hybrid laser.

Example 7 may include the subject matter of Example 5, and further specifies that the trench width at the first end of the apparatus is wider than the trench width at the second end of the apparatus, wherein the first and second active regions form a part of a hybrid photodetector.

Example 8 may include the subject matter of Example 1, and further specifies that the second semiconductor region includes: a third trench disposed on the first side of the optical waveguide such that the first trench is between the third trench and the optical waveguide, and a fourth trench disposed on the second side of the optical waveguide such that the second trench is between the fourth trench and the optical waveguide.

Example 9 may include the subject matter of Example 1, and further specifies that the semiconductor materials are selected from group III, group IV, or group V semiconductors.

Example 10 may include the subject matter of any of Examples 1 to 9, and further specifies that a layer of the first semiconductor region is directly bonded with a layer of the second semiconductor region, wherein the layer of the first semiconductor region is composed of indium phosphide, and wherein the layer of the second semiconductor region is composed of silicon.

Example 11 may include the subject matter of Example 8, and further specifies that the apparatus further comprises a first mode converter component comprising a first extension of the second semiconductor region and configured to couple the second semiconductor region with the light input component, wherein the trenches are configured to extend into the first mode converter component at determined respective first angles relative to the optical waveguide.

Example 12 may include the subject matter of Example 11, and further specifies that the apparatus further comprises a second mode converter component comprising a second extension of the second semiconductor region and configured to couple the second semiconductor region with a light output component coupled with the apparatus and configured to output the light transmitted by the optical waveguide, wherein the trenches are configured to extend into the second mode converter component at determined respective second angles relative to the optical waveguide.

Example 13 may include the subject matter of Example 12, and further specifies that the first and second mode converters further comprise first and second extensions of the first semiconductor region and are configured such that respective shapes of the first and second extensions are tapered toward an end of a respective extension.

Example 14 is a system including at least one hybrid optical apparatus, wherein the hybrid optical apparatus comprises: a first semiconductor region including an active region of one or more layers of semiconductor materials; a second semiconductor region coupled with the first semiconductor region, wherein the second semiconductor region includes an optical waveguide configured to transmit light inputted by a light input component coupled with the apparatus, wherein the optical waveguide is defined by a first trench disposed on a first side of the optical waveguide and a second trench disposed on a second side of the optical waveguide opposite the first side of the optical waveguide, wherein the second semiconductor region includes at least one mode converter component configured to couple the second semiconductor region with the light input component, wherein the trenches are configured to extend into the mode converter component at determined angles relative to the optical waveguide.

Example 15 may include the subject matter of Example 14, and further specifies that the hybrid optical apparatus is coupled with a light output component configured to output the light transmitted by the optical waveguide, wherein the second semiconductor region includes another mode converter component configured to couple the second semiconductor region with the light output component, wherein the trenches are configured to extend into the another mode converter component at determined angles relative to the optical waveguide.

Example 16 may include the subject matter of Example 15, and further specifies that the apparatus comprises a hybrid amplifier, hybrid photodetector or a gain section of a hybrid laser.

Example 17 may include the subject matter of Example 14, and further specifies that the second semiconductor region includes: a third trench disposed on the first side of the optical waveguide such that the first trench is between the third trench and the optical waveguide, and a fourth trench disposed on the second side of the optical waveguide such that the second trench is between the fourth trench and the optical waveguide.

Example 18 may include the subject matter of Example 14, and further specifies that the semiconductor materials are selected from group III, group IV, or group V semiconductors.

Example 19 may include the subject matter of Example 14, and further specifies that a width of each trench varies along a length of the apparatus in order to control optical power density of the light transmitted along the optical waveguide.

Example 20 may include the subject matter of Example 19, and further specifies that the active region includes a current channel configured to have a width that substantially conforms to the varied width of the waveguide trenches.

Example 21 may include the subject matter of any of Examples 14-20, and further specifies that the system is a selected one of a laptop, a netbook, a notebook, an ultrabook, a smartphone, a tablet, a personal digital assistant, an ultramobile PC, a mobile phone, a desktop computer, a server, a printer, a scanner, a monitor, a set-top box, an entertainment control unit, a digital camera, a portable music player, or a digital video recorder.

Example 22 is a method for making a hybrid optical apparatus, comprising: forming a first semiconductor region including an active region of one or more layers of semiconductor materials from group III, group IV, or group V semiconductors; and forming a first trench and a second trench in a second semiconductor region coupled with the first semiconductor region, the first trench disposed opposite the second trench an optical waveguide, the first and second trenches defining an optical waveguide disposed between the trenches; wherein the forming includes varying a width of the trenches along a length of the hybrid optical apparatus to control optical power density of light transmitted along the optical waveguide.

Example 23 may include the subject matter of Example 22, and further specifies that the method further comprises: forming a third trench on a first side of the optical waveguide such that the first trench is between the third trench and the optical waveguide, and forming a fourth trench on a second side of the optical waveguide such that the second trench is between the fourth trench and the optical waveguide.

Example 24 may include the subject matter of Example 22, and further specifies that the method further comprises: extending portions of the trenches about respective ends of the second semiconductor region along the length of the hybrid optical apparatus, wherein extending includes disposing the extended portions of the trenches at determined angles relative to the optical waveguide.

Example 25 may include the subject matter of Example 22, and further specifies that the method further comprises: shaping the first semiconductor region so as to taper respective ends of the first semiconductor region.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A hybrid optical apparatus comprising:
   a first semiconductor region including an active region of one or more layers of semiconductor materials; and
   a second semiconductor region coupled with the first semiconductor region, wherein the second semiconductor region includes an optical waveguide configured to transmit light inputted by a light input component coupled with the apparatus, and two or more trenches disposed substantially along a length of the apparatus and filled with gas or dielectric material having a refractive index below a threshold, wherein the optical waveguide is defined by a first trench of the two or more trenches disposed on a first side of the optical waveguide, and a second trench of the two or more trenches disposed on a second side of the optical waveguide opposite the first side of the optical waveguide, wherein a width of each trench varies along the length of the apparatus to control optical power density of the light transmitted along the optical waveguide, wherein the length of the apparatus is defined along a direction of light through the apparatus.

2. The apparatus of claim 1, wherein the apparatus is coupled with a light output component configured to output the light transmitted by the optical waveguide.

3. The apparatus of claim 1, wherein the active region includes a current channel, the current channel comprising a multiple quantum well (MQW) layer.

4. The apparatus of claim 3, wherein the current channel is configured to have a width that substantially conforms to the varied width of the waveguide trenches.

5. The apparatus of claim 1, wherein the apparatus includes a first end and a second end, wherein the first end includes a light input component and the second end includes a light output component.

6. The apparatus of claim 5, wherein the trench width at the first end of the apparatus is narrower than the trench width at the second end of the apparatus, wherein the apparatus comprises a hybrid amplifier or a gain section of a hybrid laser.

7. The apparatus of claim 5, wherein the trench width at the first end of the apparatus is wider than the trench width at the second end of the apparatus, wherein the first and second active regions firm a part of a hybrid photodetector.

8. The apparatus of claim 1, wherein the second semiconductor region includes:
   a third trench of the two or more trenches disposed on the first side of the optical waveguide such that the first trench is between the third trench and the optical waveguide, and
   a fourth trench of the two or more trenches disposed on the second side of the optical waveguide such that the second trench is between the fourth trench and the optical waveguide.

9. The apparatus of claim 1, wherein the semiconductor materials are selected from group III, group IV, or group V semiconductors.

10. The apparatus of claim 1, wherein a layer of the first semiconductor region is directly bonded with a layer of the second semiconductor region, wherein the layer of the first semiconductor region is composed of indium phosphide, and wherein the layer of the second semiconductor region is composed of silicon.

11. The apparatus of claim 8, further comprising a first mode converter component comprising a first extension of the second semiconductor region and configured to couple the second semiconductor region with the light input component, wherein the trenches are configured to extend into the first mode converter component at determined respective first angles relative to the optical waveguide.

12. The apparatus of claim 11, further comprising a second mode converter component comprising a second extension of the second semiconductor region and configured to couple the second semiconductor region with a light output component coupled with the apparatus and configured to output the light transmitted by the optical waveguide, wherein the trenches are configured to extend into the second mode converter component at determined respective second angles relative to the optical waveguide.

13. The apparatus of claim 12, wherein the first and second mode converters further comprise first and second extensions of the first semiconductor region and are configured such that respective shapes of the first and second extensions are tapered toward an end of a respective extension.

14. A system including at least one hybrid optical apparatus, wherein the hybrid optical apparatus comprises:
   a first semiconductor region including an active region of one or more layers of semiconductor materials;
   a second semiconductor region coupled with the first semiconductor region, wherein the second semiconductor region includes an optical waveguide configured to transmit light inputted by a light input component coupled with the apparatus, and two or more trenches disposed substantially along a length of the apparatus and filled with gas or dielectric material having a refractive index below a threshold, wherein the optical waveguide is defined by a first trench of the two or more trenches disposed on a first side of the optical waveguide and a second trench of the two or more trenches disposed on a second side of the optical waveguide opposite the first side of the optical waveguide, wherein the second semiconductor region includes at least one mode converter component configured to couple the second semiconductor region with the light input component, wherein the trenches are configured to extend into the mode converter component at determined angles relative to the optical waveguide, wherein the length of the apparatus is defined along a direction of light through the apparatus.

15. The system of claim 14, wherein the hybrid optical apparatus is coupled with a light output component configured to output the light transmitted by the optical waveguide, wherein the second semiconductor region includes another mode converter component configured to couple the second semiconductor region with the light output component, wherein the trenches are configured to extend into the another mode converter component at determined angles relative to the optical waveguide.

16. The system of claim 15, wherein the apparatus comprises a hybrid amplifier, hybrid photodetector or a gain section of a hybrid laser.

17. The system of claim 14, wherein the second semiconductor region includes:
a third trench of the two or more trenches disposed on the first side of the optical waveguide such that the first trench is between the third trench and the optical waveguide, and
a fourth trench of the two or more trenches disposed on the second side of the optical waveguide such that the second trench is between the fourth trench and the optical waveguide.

18. The system of claim 14, wherein the semiconductor materials are selected from group III, group IV, or group V semiconductors.

19. The system of claim 14, wherein a width of each trench varies along a length of the apparatus in order to control optical power density of the light transmitted along the optical waveguide.

20. The system of claim 19, wherein the active region includes a current channel configured to have a width that substantially conforms to the varied width of the waveguide trenches.

21. The system of claim 14, wherein the system is a selected one of a laptop, a netbook, a notebook, an ultrabook, a smartphone, a tablet, a personal digital assistant, an ultra mobile PC, a mobile phone, a desktop computer, a server, a printer, a scanner, a monitor, a set-top box, an entertainment control unit, a digital camera, a portable music player, or a digital video recorder.

22. A method for making a hybrid optical apparatus, comprising:
forming a first semiconductor region of a hybrid optical apparatus including an active region of one or more layers of semiconductor materials from group III, group IV, or group V semiconductors; and
forming two or more trenches substantially along a length of the hybrid optical apparatus in a second semiconductor region coupled with the first semiconductor region, the forming including disposing a first trench of the two or more trenches along a length of the hybrid optical apparatus, and disposing a second trench of the two or more trenches opposite the first trench along the length of the hybrid optical apparatus the first and second trenches defining an optical waveguide disposed between the trenches, wherein the length of the hybrid optical apparatus is defined along a direction of light through the hybrid optical apparatus;
wherein the forming includes: varying a width of the trenches along the length of the hybrid optical apparatus to control optical power density of light transmitted along the optical waveguide; and filling the trenches with gas or dielectric material having a refractive index below a threshold.

23. The method of claim 22, further comprising:
forming a third trench of the two or more trenches on a first side of the optical waveguide such that the first trench is between the third trench and the optical waveguide; and
forming a fourth trench of the two or more trenches on a second side of the optical waveguide such that the second trench is between the fourth trench and the optical waveguide.

24. The method of claim 22, further comprising:
extending portions of the trenches about respective ends of the second semiconductor region along the length of the hybrid optical apparatus, wherein extending includes disposing the extended portions of the trenches at determined angles relative to the optical waveguide.

25. The method of claim 22, further comprising:
shaping the first semiconductor region so as to taper respective ends of the first semiconductor region.

* * * * *